US006316802B1

United States Patent
Schindler et al.

(10) Patent No.: US 6,316,802 B1
(45) Date of Patent: Nov. 13, 2001

(54) EASY TO MANUFACTURE INTEGRATED SEMICONDUCTOR MEMORY CONFIGURATION WITH PLATINUM ELECTRODES

(75) Inventors: Günther Schindler; Walter Hartner; Frank Hintermaier, all of München; Carlos Mazure-Espejo, Zorneding; Rainer Bruchhaus, München; Wolfgang Hönlein, Unterhaching; Manfred Engelhardt, Feldkirchen-Westerham, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/282,091

(22) Filed: Mar. 30, 1999

Related U.S. Application Data

(63) Continuation of application No. PCT/DE97/02005, filed on Sep. 9, 1997.

(30) Foreign Application Priority Data

Sep. 30, 1996 (DE) .............................. 196 40 218

(51) Int. Cl.⁷ .................................. H01L 27/108
(52) U.S. Cl. ................. 257/306; 257/298; 257/304; 257/310; 257/758; 257/765; 257/768; 257/769; 257/770

(58) Field of Search .................. 257/306, 298, 257/304, 310, 758, 765, 768–770

(56) References Cited

U.S. PATENT DOCUMENTS

| 5,330,931 |   | 7/1994  | Emesh et al. .                |
|-----------|---|---------|-------------------------------|
| 5,466,629 | * | 11/1995 | Mihara et al. ......... 437/60 |
| 5,466,964 |   | 11/1995 | Sakao et al. .                |
| 5,491,102 |   | 2/1996  | Desu et al. .                 |
| 5,581,436 | * | 12/1996 | Summerfelt et al. ..... 361/321 |
| 5,625,529 | * | 4/1997  | Lee et al. ............. 361/321 |
| 5,965,494 | * | 10/1999 | Terashima et al. ..... 505/210 |

FOREIGN PATENT DOCUMENTS

| 0 489 519 A2 | 6/1992  | (EP) . |
| 0 514 149 A1 | 11/1992 | (EP) . |
| 0 521 676 A1 | 1/1993  | (EP) . |
| 0 698 918 A1 | 2/1996  | (EP) . |

\* cited by examiner

Primary Examiner—Eddie Lee
Assistant Examiner—Matthew E Warren
(74) Attorney, Agent, or Firm—Herbert L. Lerner; Laurence A. Greenberg; Werner H. Stemer

(57) ABSTRACT

The integrated semiconductor memory configuration has a semiconductor body in which selection transistors and storage capacitors are integrated. The storage capacitors have a dielectric layer configured between two electrodes. At least the upper electrode is constructed in a layered manner with a platinum layer, that is seated on the dielectric layer, and a thicker, base metal layer lying above the platinum layer.

9 Claims, 1 Drawing Sheet

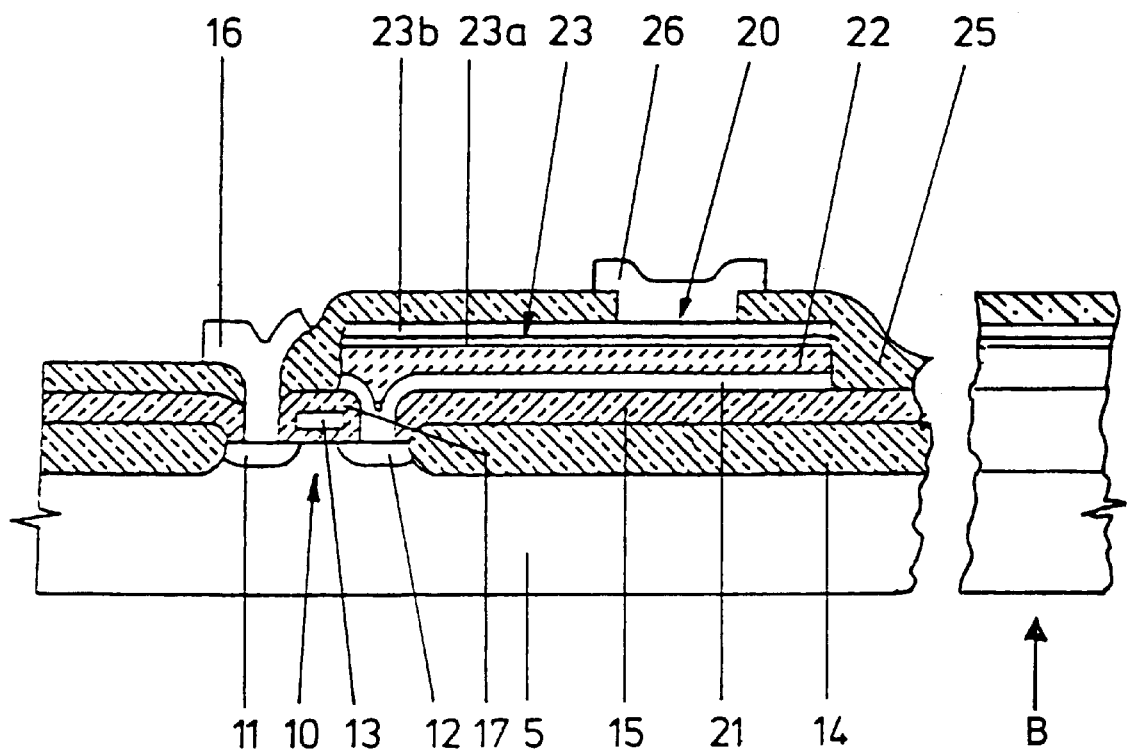

EASY TO MANUFACTURE INTEGRATED SEMICONDUCTOR MEMORY CONFIGURATION WITH PLATINUM ELECTRODES

CROSS-REFERENCE TO RELATED APPLICATION

This is a continuation of copending International Application PCT/DE97/02005, filed Sep. 9, 1997, which designated the United States.

BACKGROUND OF THE INVENTION

Field of the Invention

The invention relates in general to the field of semiconductors, and specifically to a semiconductor memory configuration having selection transistors and storage capacitors constructed with at least one multi-layered electrode.

Such integrated semiconductor memory configurations are described in European Patent Application EP 0 514 149A1, where the upper and lower electrodes which bound a dielectric layer at the top and bottom are configured in a multilayered manner. The layer facing the substrate more closely has a high melting point and does not react with the dielectric layer. Titanium, tantalum, tungsten, molybdenum and the like are examples of materials that can be used for the layer facing the substrate more closely. Platinum, palladium, rhodium and aluminum are examples of materials that can be used for the layer configured above the former layer. The upper electrode seated on the dielectric layer consequently has, as shown by an example given in European Patent Application EP 0 514 149 (See FIG. 1 therein), a lower layer made from titanium and a layer made from platinum seated above the lower layer. The titanium layer is intended to have a thickness of between 10 and 150 nm and the platinum layer a thickness of between 100 and 1200 nm.

Oxide-ceramic dielectrics are being used for the storage capacitor since these dielectrics make it possible to realize comparatively large capacitances in conjunction with a small space requirement. High-$\epsilon$ materials such as, for example, $(Ba_xSr_{1-x}TiO_3)$ or the ferroelectric material $SrBi_2Ta_2O_9$ are used as oxide-ceramic dielectrics. Because of the high proportion of oxygen in the dielectric and the oxygen atmosphere that is needed during the deposition or during the heat treatment, electrode materials employed heretofore, such as aluminum, polysilicon or suicides, can no longer be used.

Therefore, platinum is being used as a new electrode material, as shown by U.S. Pat. No. 5,330,931 and U.S. Pat. No. 5,466,629, for example.

A satisfactory solution to the patterning of platinum has not been found heretofore. The etching operation is primarily carried out by physical processes using high-energy ions. Furthermore, it has become known to etch platinum anisotropically. However, the etching profiles that can be achieved are still not satisfactory in the case of anisotropic etching. Moreover, platinum has a higher electrical resistivity than, for example, aluminum, namely approximately 10 $\mu$ohms*cm. These disadvantages have made platinum unattractive heretofore as an electrode material even though it has outstanding properties with regard to the junction with ferroelectrics and high-$\epsilon$ dielectrics.

SUMMARY OF THE INVENTION

It is accordingly an object of the present invention to provide an integrated semiconductor memory configuration that is improved with respect to the previously known semiconductor memory configurations with pure platinum electrodes and is particularly easy to fabricate.

With the foregoing and other objects in view there is provided, in accordance with the invention, an integrated semiconductor memory configuration, comprising:

a semiconductor body with selection transistors; and storage capacitors formed on the semiconductor body, each storage capacitor including an upper electrode, a lower electrode, and a dielectric layer disposed therebetween;

the upper electrode including a platinum layer seated on the dielectric layer and a base metal layer disposed on the platinum layer; the platinum layer having a thickness of up to substantially 10 nm, and the base metal layer having a thickness being greater than the thickness of the platinum layer.

In accordance with an added feature of the invention, the upper electrode extends to other regions of the memory configuration forming an interconnection.

In accordance with an additional feature of the invention, the the thickness of the base metal layer is in a range of greater than substantially 10 nm up to substantially 800 nm.

In accordance with another feature of the invention, the base metal layer is a layer selected from the group consisting of an aluminum layer and a tungsten layer.

In accordance with a further feature of the invention, the lower electrode includes a platinum layer having a thickness and being seated on the dielectric layer, and a base metal layer disposed on the platinum layer and having a thickness being greater than the thickness of the platinum layer.

In accordance with a further added feature of the invention, the semiconductor body has an upper main surface, and the lower electrode, the upper electrode, and the dielectric layer are disposed substantially parallel to the upper main surface of the semiconductor body.

In accordance with a further additional feature of the invention, the the dielectric layer is a layer selected from the group consisting of a ferroelectric layer and a high-$\epsilon$ dielectric layer.

In accordance with another added feature of the invention, the platinum layer is a layer produced by a sputtering process.

In accordance with a concomitant feature of the invention, the base metal layer is a layer produced by a CVD process.

Accordingly, at least the upper electrode of the storage capacitor electrodes is constructed in a layered manner with a platinum layer, which faces the dielectric layer, and a base metal layer, which is seated on the platinum layer and has a larger thickness than the platinum layer. By way of example, an aluminum layer or a tungsten layer can be used as the base metal layer.

The platinum layer has a thickness of a few nm, for example up to 10 nm. The base metal layer lying above the platinum layer, on the other hand, is thicker and has a thickness of, preferably, several hundred nm, and preferably up to 800 nm.

The inventive integrated semiconductor memory configuration that has an electrode constructed like a sandwich, has the following advantages over electrodes made of pure platinum or another noble metal:

If the layered electrode structure is used for both electrodes of the storage capacitor, the symmetry of the electrode configuration is preserved by virtue of the thin platinum layer. It is thus possible to avoid disadvantageous effects, such as, for example, imprint or shifting of the hysteresis loop.

It is possible to use a known standard technology in order to apply the base metal to the thin platinum layer. A suitable standard technology is, for example, the CVD deposition of aluminum or tungsten.

The resistivity of the electrode structure according to the invention is smaller as compared to electrodes made of pure platinum. As a result, the upper electrode according to the invention can be used not just for an individual storage capacitor, but rather for an entire memory cell array having a multiplicity of individual storage capacitors, and also as an interconnection in other regions of the integrated semiconductor memory configuration. The advantage of the smaller electrical resistance of the upper electrode is beneficial in this context.

A very thin platinum layer does not make high demands on the etching process with respect to the edge steepness, etching rate, etc. The etching process for platinum is therefore simplified. The other metal applied to the platinum layer can be etched using a standard process and be used as a hard mask for the platinum etching.

With three-dimensional structures having an aspect ratio that is not excessively large, it is possible to use a sputtering process for platinum as long as this process yields at least a slight degree of edge covering. The base metal applied to the platinum layer can be deposited by CVD (chemical vapor deposition), so that the relatively slight difference in thickness in the case of the platinum layer is insignificant.

Therefore, the invention eliminates the necessity of developing a CVD process for platinum.

Other features which are considered as characteristic for the invention are set forth in the appended claims.

Although the invention is illustrated and described herein as embodied in an integrated semiconductor memory configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The FIGURE is a cross section showing an exemplary embodiment of the invention.

DESCRIPTION OF THE PREFERRED EMBODIMENTS

In the illustrated FIGURE, a semiconductor body 5 is made from silicon material, for example, is illustrated. A selection transistor 10 is integrated below the upper main area of this semiconductor body 5 in a manner known per se. This selection transistor 10 has a drain region 11 and an adjacent source region 12. The drain region 11 and the source region 12 are, by way of example, $n^+$-doped well regions that are integrated at a distance from one another in a p-type substrate of the semiconductor body 5. Furthermore, the selection transistor 10 has, in a manner known per se, a gate region 13 surrounded by an insulation layer 17. As is customary in the case of selection transistors in memory cells, the gate region 13 is situated above the interspace between the drain region 11 and the source region 12. The gate region 13 is preferably electrically conductively connected to a bit line of the memory configuration. The drain region 11 is preferably electrical connected with the word line of the memory configuration through a contact 16.

The source region 12 is electrically conductively connected to a first electrode 21. In the illustrated exemplary embodiment of the sectional view of the semiconductor body 5, this electrode 21, proceeding from the source region 12, extends slightly upward in order then to continue, in an L-shaped manner toward the right, approximately parallel to the upper main area of the semiconductor body 5. A dielectric layer 22 is configured over this first electrode 21 and a second or upper electrode 23 is configured over this dielectric layer 22. The two electrodes 21, 23 and the dielectric layer 22 form the storage capacitor 20 of a memory cell of the semiconductor memory configuration according to the invention. The upper electrode 23 is electrically conductively connected to a contact 26. This contact 26 is preferably electrically connected to the reference-ground potential of the semiconductor configuration.

The entire semiconductor memory configuration comprises a multiplicity of memory cells, as illustrated in the FIGURE. In order to electrically isolate the individual memory cells from one another, the selection transistor 10 with its drain region 11, source region 12 and gate region 13 is surrounded by a p+-type layer 14 in the form of a frame. An insulation layer 15 is applied over this $p^+$-type layer 14 and extends in between the lower electrode 21 and the $p^+$-type layer 14. The layer designated by the reference symbol 25 is a passivation layer applied to the semiconductor body 5 before the metallization step for the contacts 16 and 26.

As is shown by the sectional view of the exemplary embodiment illustrated, the upper electrode 23 of the storage capacitor 20 is constructed in a layered manner. The electrode 23 comprises a comparatively thin platinum layer 23a, that is seated directly on the dielectric layer 22. The platinum layer 23a may, for example, have a thickness of up to about 10nm. A further metal layer 23b is seated above this platinum layer 23a and thus remote from the dielectric layer 22. This further metal layer 23b may be made from a standard material of the kind used heretofore in electrodes for storage capacitors in integrated semiconductor memory configurations. The metal layer 23b may be made from a base metal, preferably aluminum or tungsten. This further metal layer 23b has a larger thickness than the platinum layer 23a. The metal layer 23b has a thickness of greater than 10 nm and preferably less than about 800 nm.

The second metal layer 23b can be applied to the platinum layer 23a by using a standard method, for example, CVD deposition. The platinum layer 23a can be applied to the dielectric layer 22 by a sputtering process, for example.

Furthermore, it is also possible in principle to construct the first electrode 21 in a similar manner to the second electrode 23. In this case, the electrode 21 would likewise be constructed in a layered manner, in which case the thin platinum layer must then face the dielectric layer 22. Because of the desired symmetry, the second metal layer of the first electrode 21 should be made from the same material as the second metal layer 23b of the second electrode 23.

Ferroelectrics or high-$\epsilon$ dielectrics can be used as the dielectric.

As additionally shown in the FIGURE, the layered upper electrode 23 can be used as an interconnection in remaining regions of the semiconductor memory configuration. For this purpose, the layer structure with the platinum layer 23a and the base metal layer 23b seated above the latter continues into a remaining region B of the semiconductor body 5.

Region B is indicated diagrammatically. The resistivity of the electrode structure 23 according to the invention is smaller than that of electrodes made from pure platinum, with the result that the layer structure can readily be used as interconnection in the rest of the semiconductor body 5.

We claim:

1. An integrated semiconductor memory configuration, comprising:

a semiconductor body with selection transistors; and storage capacitors formed on said semiconductor body, each storage capacitor including an upper electrode, a lower electrode, and a dielectric layer disposed therebetween;

said upper electrode including a platinum layer seated on said dielectric layer and a base metal layer disposed on said platinum layer; said platinum layer having a thickness of up to substantially 10 nm, said base metal layer having a thickness greater than said thickness of said platinum layer, and in a range of greater than substantially 10 nm up to substantially 800 nm.

2. The integrated semiconductor memory configuration according to claim 1, wherein said upper electrode extends to other regions of the memory configuration forming an interconnection.

3. The integrated semiconductor memory configuration according to claim 1, wherein said lower electrode includes a platinum layer having a thickness and being seated on said dielectric layer, and a base metal layer disposed on said platinum layer and having a thickness being greater than said thickness of said platinum layer.

4. The integrated semiconductor memory configuration according to claim 1, wherein said semiconductor body has an upper main surface, and said lower electrode, said upper electrode, and said dielectric layer are disposed substantially parallel to said upper main surface of said semiconductor body.

5. The integrated semiconductor memory configuration according to claim 1, wherein said dielectric layer is a layer selected from the group consisting of a ferroelectric layer and a high-$\epsilon$ dielectric layer.

6. The integrated semiconductor memory configuration according to claim 1, wherein said platinum layer is a layer produced by a sputtering process.

7. The integrated semiconductor memory configuration according to claim 1, wherein said base metal layer is a layer produced by a CVD process.

8. An integrated semiconductor memory configuration, comprising:

a semiconductor body with selection transistors; and storage capacitors formed on said semiconductor body, each storage capacitor including an upper electrode, a lower electrode, and a dielectric layer disposed therebetween;

said upper electrode including a platinum layer seated on said dielectric layer and a base metal layer disposed on said platinum layer; said platinum layer having a thickness of up to substantially 10 nm, and said base metal layer having a thickness being greater than said thickness of said platinum layer;

said upper electrode extending to other regions of the memory configuration forming an interconnection; and said thickness of said base metal layer being in a range of greater than substantially 10 nm up to substantially 800 nm.

9. An integrated semiconductor memory configuration comprising:

a semiconductor body with selection transistors; and storage capacitors formed on said semiconductor body, each storage capacitor including an upper electrode, a lower electrode, and a dielectric layer disposed therebetween;

said upper electrode including a platinum layer seated on said dielectric layer and a base metal layer selected from the group consisting of an aluminum layer and a tungsten layer disposed on said platinum layer; said platinum layer having a thickness of up to substantially 10 nm, and said base metal layer having a thickness greater than said thickness of said platinum layer.

* * * * *